(12) United States Patent
Chung

(10) Patent No.: US 7,535,260 B2
(45) Date of Patent: May 19, 2009

(54) LOGIC GATES, SCAN DRIVERS AND ORGANIC LIGHT EMITTING DISPLAYS USING THE SAME

(75) Inventor: Bo Yong Chung, Yongin-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/783,014

(22) Filed: Apr. 5, 2007

(65) Prior Publication Data

US 2008/0036697 A1    Feb. 14, 2008

(30) Foreign Application Priority Data

Aug. 8, 2006   (KR) .................... 10-2006-0074584

(51) Int. Cl.
*G11C 8/00* (2006.01)
*H03K 19/082* (2006.01)
*H03K 19/094* (2006.01)

(52) U.S. Cl. .................. 326/105; 326/104; 326/112; 326/119

(58) Field of Classification Search ......... 326/104–106, 326/112, 119
See application file for complete search history.

(56) References Cited

U.S. PATENT DOCUMENTS 6,670,771 B2 * 12/2003 Shin et al. ............... 315/169.2
6,831,625 B2 * 12/2004 Matsushima et al. .......... 345/98
6,842,165 B2 * 1/2005 Inoue ......................... 345/107

FOREIGN PATENT DOCUMENTS

| JP | 09-265782 | 10/1997 |
|----|-----------|---------|
| KR | 10-1996-0003220 | 3/1996 |
| KR | 10-1997-0055542 | 7/1997 |
| KR | 10-1998-0028163 | 7/1998 |
| KR | 10-2005-0113682 | 12/2005 |
| KR | 10-2005-0122688 | 12/2005 |

OTHER PUBLICATIONS

Rhyne, Fundamentals of Digital Systems Design, N.J., 1973, pp. 70-71.*

* cited by examiner

*Primary Examiner*—Anh Q Tran
(74) *Attorney, Agent, or Firm*—Lee & Morse, P.C.

(57) ABSTRACT

A logic gate includes a first driver connected to a first power source, a first control transistor connected between a first node and a second power source to control a voltage of the first node, a second driver connected between a gate electrode of the first control transistor and the second power source, a third driver connected between the first power source and the second power source, a second control transistor connected between the third driver and the second power source, and having a first electrode connected to an output terminal, and a fourth driver arranged between a gate electrode of the second control transistor and the second power source, wherein the first control transistor, the second control transistor and each transistor of the first driver, the second driver, the third driver and the fourth driver are PMOS transistors.

25 Claims, 9 Drawing Sheets

LOGIC GATES, SCAN DRIVERS AND ORGANIC LIGHT EMITTING DISPLAYS USING THE SAME

BACKGROUND OF THE INVENTION

1. Field of the Invention

The present invention relates to logic gates, scan drivers and organic light emitting displays using the same. More particularly, the invention relates to logic gates capable of being realized with PMOS transistors, and scan drivers and organic light emitting displays using such a logic gate.

2. Description of the Related Art

Various types of flat panel displays are being researched and developed. In general, flat panel displays are capable of having a lower weight and/or a lower volume than cathode ray tubes. Flat panel displays include, e.g., liquid crystal displays, field emission displays, plasma display panels, organic light emitting display devices, etc.

In general, organic light emitting display devices display an image using an organic light emitting diode that generates light by recombination of electrons and holes. Such organic light emitting display devices may be advantageous by having relatively rapid response times and low power consumption characteristics.

Organic light emitting displays may include pixels arranged in a matrix-type manner, a data driver for driving data lines connected to the pixels, and a scan driver for driving scan lines connected to the pixels.

The scan driver may select pixels line by line while sequentially supplying a scan signal during every horizontal period. The data driver may supply a data signal to the pixels selected by the scan signal, line by line. Therefore, each of the pixels may display a predetermined image corresponding to the data signal by supplying a predetermined electric current, corresponding to the respective data signal, to an organic light emitting diode.

The scan driver should be mounted on a panel to, e.g., reduce the manufacturing cost of the organic light emitting display, etc. However, it is difficult to mount the scan driver on the panel because the conventional scan driver is composed of PMOS transistors and NMOS transistors. Thus, a number of masks necessary for manufacturing the transistors may be more than when the scan driver only includes one type of transistors, i.e., only NMOS or only PMOS. Accordingly, e.g., a scan driver capable of being realized with only PMOS transistors, i.e., no NMOS transistors, so that it may be formed on the panel is desired.

SUMMARY OF THE INVENTION

The present invention is therefore directed to logic gates, scan drivers and/or organic light emitting display, which substantially overcome one or more of the problems due to the limitations and disadvantages of the related art.

It is therefore a feature of an embodiment of the present invention to provide a logic gate capable of being realized with PMOS transistors, and a scan driver and an organic light emitting display using such a logic gate.

At least one of the above and other features and advantages of the present invention may be realized by providing a logic gate electrically connected to a first power source and a second power source having a lower voltage than the first power source, the logic gate including a first driver connected to the first power source for controlling a connection of a first node to the first power source based on a plurality of externally supplied input signals, a first control transistor connected between the first node and the second power source to control a voltage of the first node, a second driver connected between a gate electrode of the first control transistor and the second power source, a third driver connected between the first power source and the second power source, which may be driven by a voltage applied to the first node, a second control transistor connected between the third driver and the second power source, and having a first electrode connected to an output terminal, and a fourth driver arranged between a gate electrode of the second control transistor and the second power source, for controlling a connection between the gate electrode of the second control transistor and the second power source, wherein each of the first driver, the second driver, the third driver and the fourth driver includes at least one transistor, and each of the transistors of the first driver, the second driver, the third driver and the fourth driver, the first control transistor and the second control transistor are PMOS transistors.

The logic gate may include a first capacitor connected between the gate electrode and a first electrode of the first control transistor, and a second capacitor connected between the gate electrode and the first electrode of the second control transistor. The first driver may include a plurality of first transistors connected in parallel between the first power source and the first node, which may be turned on or turned off based on the input signals. A width/length ratio of the first control transistor may be set to a narrower range than a width/length ratio of each of the first transistors.

The second driver may include a second transistor having a first electrode connected to the gate electrode of the first control transistor, and a gate electrode and a second electrode that are connected to the second power source. The third driver may include a first transistor for controlling a connection of the first electrode of the second control transistor to the first power source based on a voltage of the first node. The third driver may further include a second transistor for controlling a connection of the gate electrode and the first electrode of the second control transistor based on a voltage of the first node. A width/length ratio of the second control transistor may be set to a narrower range than that of the first transistor.

The fourth driver may include a first transistor having a first electrode connected to the gate electrode of the second control transistor, and a gate electrode and a second electrode that are connected to the second power source. The fourth driver may include second and third transistors connected in parallel with the first transistor of the fourth driver between the gate electrode of the second control transistor and the second power source and the first, second and third transistors of the fourth driver may be turned on or turned off based on the input signals.

The logic gate may include a fifth driver having first transistors connected in parallel between the first electrode and the gate electrode of the first control transistor, and the first transistors of the fifth driver may be turned on or turned off based on the input signals. The second driver may include second transistors connected in series between the gate electrode of the first control transistor and the second power source, and the second transistors may be turned on or turned off based on bar signals having a reverse polarity to the input signals.

At least one of the above and other features and advantages of the present invention may be realized by providing a scan driver for driving a plurality of scan lines, including at least one decoder including a plurality of AND gates, and a plurality of NAND gates respectively connected to the scan lines and generating scan signals by performing a NAND operation on outputs of the decoder, wherein each of the AND gates and the NAND gates may be composed of a plurality of PMOS transistors.

The scan driver may include a plurality of input terminals in each of the decoders for receiving externally supplied input, signals, and a plurality of inverters connected to each of the input terminals to reverse the received input signals. The scan driver may include a plurality of input terminals in each of the decoders for receiving externally supplied input signals and bar signals, wherein HIGH polarity portions of the input and input bar signals may have a longer period than LOW polarity portions of the input and input bar signals. Each of the NAND gates may be electrically connected to a first power source and a second power source having a lower voltage than the first power source, and each of the NAND gates may include a control transistor arranged between the first power source and the second power source, and having an output terminal connected to a first electrode thereof, a plurality of first transistors arranged in parallel between a first electrode of the control transistor and the first power source, and respectively receiving externally supplied input signals, a plurality of second transistors arranged in parallel between the first electrode and a gate electrode of the control transistor, and respectively receiving the input signals, and a plurality of third transistors arranged in series between the gate electrode of the control transistor and the second power source, and receiving the input signals and input bar signals having a reversed polarity relative to the input signals.

The scan driver may include a capacitor connected between the first electrode and the gate electrode of the control transistor. Each of the AND gates may be electrically connected to a first power source and a second power source having a lower voltage than the first power source, and each of the AND gates may include a plurality of first transistors connected in parallel between the first power source and a first node and capable of receiving externally supplied input signals, respectively, a first control transistor connected between the first node and the second power source to control a voltage of the first node, a plurality of second transistors connected in parallel between a gate electrode and a first electrode of the first control transistor and capable of receiving the respective input signals, a plurality of third transistors connected in series between the gate electrode of the first control transistor and the second power source and capable of receiving input bar signals, respectively, a second control transistor for controlling a voltage supplied to an output terminal, a fourth transistor connected between the first power source and the second control transistor and being turned on or turned off based on a voltage applied to the first node, a fifth transistor connected between a gate electrode and a first electrode of the second control transistor and turned on or turned off based on the voltage applied to the first node, and a plurality of sixth transistors connected in parallel between the gate electrode of the second control transistor and the second power source and capable of receiving the respective input signals.

At least one of the above and other features and advantages of the present invention may be realized by providing a display including a data driver for supplying a data signal to data lines, a scan driver for supplying a data signal to scan lines, and a plurality of pixels connected to the data lines and scan lines and capable of charging a voltage corresponding to the respective data signal when the scan signal is supplied to the respective ones of the data lines and scan lines, wherein the scan driver includes at least one decoder including a plurality of AND gates, and a plurality of NAND gates connected respectively to respective ones of the scan lines for generating scan signals by performing a NAND operation on outputs of the decoder, and each of the AND gates and the NAND gates may be composed of a plurality of PMOS transistors.

The display may include a plurality of decoders, and the decoders may be arranged such that the decoder of the plurality of decoders receiving relatively higher frequency ones of the input signals is arranged closest to the NAND gates, and the decoder of the plurality of decoders receiving relatively lower frequency ones of the input signals is arranged furthest from the NAND gates.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
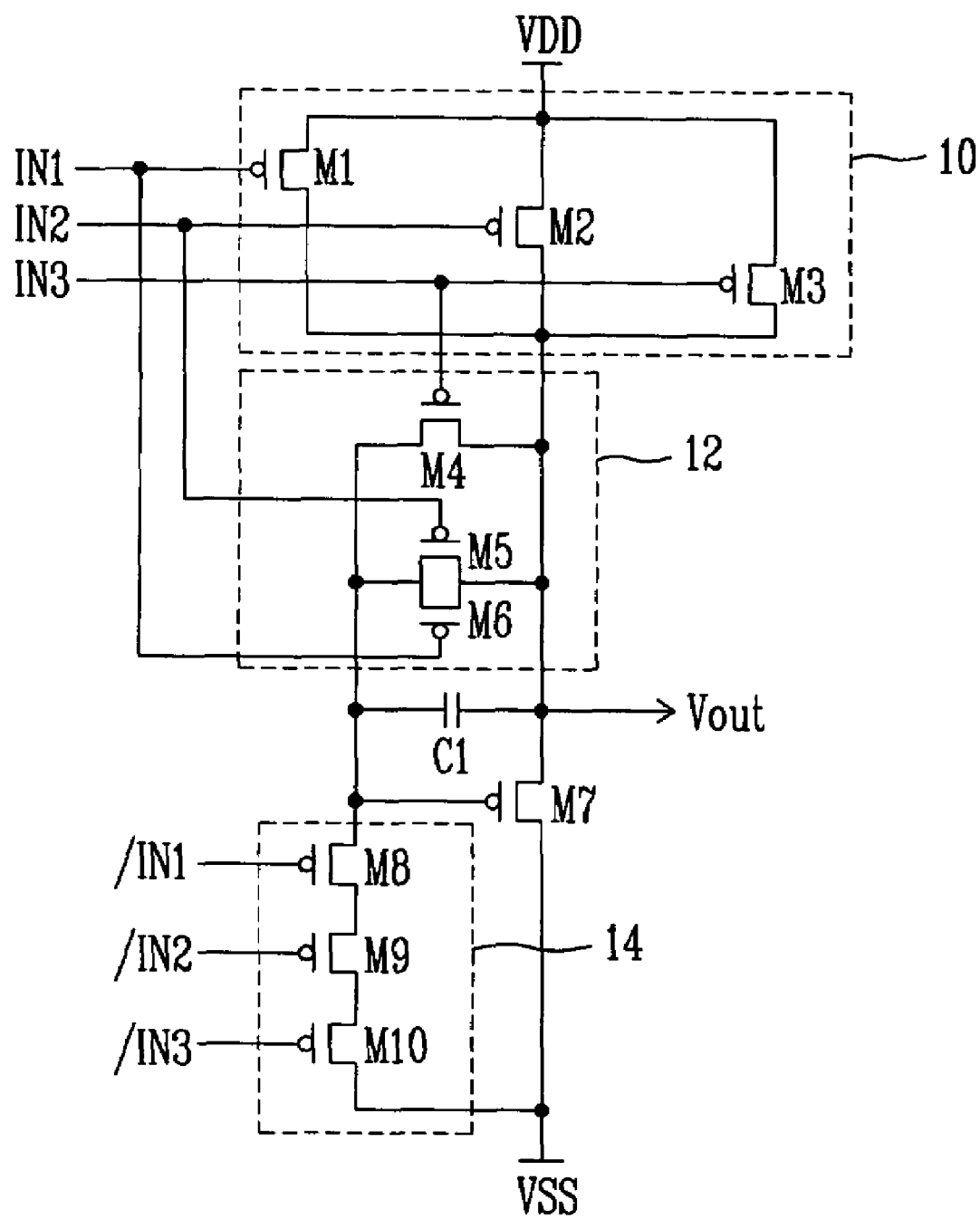
FIG. 1 illustrates a circuit diagram of an exemplary embodiment of a NAND gate according to one or more aspects of the present invention.

Korean Patent Application No. 2006-0074584, filed on Aug. 8, 2006, in the Korean Intellectual Property Office, and entitled: "Logic Gate, Scan Driver and Organic Light Emitting Display Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the following description, when one element is connected to another element, one element may be not only directly connected to another element but also indirectly connected to another element via another element. In addition, it will also be understood that when an element is referred to as being "between" two elements, it can be the only element between the two elements, or one or more intervening elements may also be present. Further, irrelative elements are omitted for clarity. Also, like reference numerals refer to like elements throughout the specification.

FIG. 1 illustrates a circuit diagram of an exemplary embodiment of a NAND gate according to one or more aspects of the present invention. As illustrated in FIG. 1, in some embodiments of the invention, the NAND gate may be realized with only PMOS transistors, i.e., no NMOS transistors.

Referring to FIG. 1, in some embodiments, the NAND gate may include a seventh transistor M7, i.e., a control transistor, for controlling a voltage supplied to an output terminal Vout, a first driver 10, a second driver 12 and a third driver 14.

The first driver 10 may be arranged between a first power source VDD and the seventh transistor M7. The first driver 10 may control a connection of a first electrode of the seventh transistor M7 to the first power source VDD based on polarities, e.g., HIGH or LOW, of a first input signal IN1, a second input signal IN2 and/or a third input signal IN3.

The second driver 12 may be arranged between the first electrode and a gate electrode of the seventh transistor M7. The second driver 12 may control a connection of the gate electrode and the first electrode of the seventh transistor M7 based on polarities, e.g., HIGH or LOW, of the first input signal IN1, the second input signal IN2 and/or the third input signal IN3.

The third driver 14 may be arranged between the gate electrode of the seventh transistor M7 and a second power source VSS. The third driver 14 may control a connection between the gate electrode of the seventh transistor M7 and the second power source VSS based on polarities, e.g., HIGH or LOW, of a first input bar signal /IN1, a second input bar signal /IN2 and/or a third input bar signal /IN3.

The seventh transistor M7 may be turned on or turned off based on a voltage supplied to the gate electrode of the seventh transistor M7. For example, the seventh transistor M7 may be turned off when a voltage of the first power source VDD is supplied to the gate electrode of the seventh transistor M7, and the seventh transistor M7 may be turned on when a voltage of the second power source VSS is supplied to the gate electrode of the seventh transistor M7.

In embodiments of the invention, the first power source VDD may be set to have a higher voltage than the second power source VSS. For example, the first power source VDD may be set to a voltage of a positive polarity, and the second power source VSS may be set to a ground voltage or a voltage of a negative polarity.

The first driver 10 may include a first transistor M1, a second transistor M2 and a third transistor M3, which may all be connected in parallel between the first power source VDD and the first electrode of the seventh transistor M7. In such embodiments, the first driver 10 may electrically connect the first electrode of the seventh transistor M7 to the first power source VDD when any one of the first input signal IN1, the second input signal IN2 and/or the third input signal IN3 is set to a LOW polarity.

More specifically, in some embodiments of the invention, the first transistor M1 may be connected between the first power source VDD and the first electrode of the seventh transistor M7, and may be turned on or turned off by the first input signal IN1. Thus, e.g., the first transistor M1 may be turned on when the first input signal IN1 has a LOW polarity, and may be turned off in other cases.

The second transistor M2 may be connected between the first power source VDD and the first electrode of the seventh transistor M7, and may be turned on or turned off by the second input signal IN2. Thus, e.g., the second transistor M2 may be turned on when the second input signal IN2 has a LOW polarity, and may be turned off in other cases.

The third transistor M3 may be connected between the first power source VDD and the first electrode of the seventh transistor M7, and may be turned on or turned off by the third input signal IN3. Thus, e.g., the third transistor M3 may be turned on when the third input signal IN3 has a LOW polarity, and may be turned off in other cases.

The second driver 12 may include a fourth transistor M4, a fifth transistor M5 and a sixth transistor M6, which may all be connected in parallel between the first electrode and the gate electrode of the seventh transistor M7. In such embodiments, the second driver 12 may electrically connect the gate electrode of the seventh transistor M7 to the first electrode of the seventh transistor M7 when any one of the first input signal IN1, the second input signal IN2 and/or the third input signal IN3 has a LOW polarity.

More specifically, e.g., in some embodiments of the invention, the fourth transistor M4 may be connected between the first electrode and the gate electrode of the seventh transistor M7, and may be turned on or turned off by the third input signal IN3. Thus, e.g., the fourth transistor M4 may be turned on when the third input signal IN3 has a LOW polarity, and may be turned off in other cases.

The fifth transistor M5 may be connected between the first electrode and the gate electrode of the seventh transistor M7, and may be turned on or turned off by the second input signal IN2. Thus, e.g., the fifth transistor M5 may be turned on when the second input signal IN2 has a LOW polarity, and may be turned off in other cases.

The sixth transistor M6 may be connected between the first electrode and the gate electrode of the seventh transistor M7, and may be turned on or turned off by the first input signal IN1. Thus, e.g., the sixth transistor M6 may be turned on when the first input signal IN1 has a LOW polarity, and may be turned off in other cases.

The third driver 14 may include an eighth transistor M8, a ninth transistor M9 and a tenth transistor M10, which may all be connected in series between the gate electrode of the seventh transistor M7 and the second power source VSS. In such embodiments, the third driver 14 may electrically connect the second power source VSS to the gate electrode of the seventh transistor M7 when a first input bar signal /IN1, a second input bar signal /IN2 and a third input bar signal /IN3 have a LOW polarity.

More specifically, e.g., in some embodiments of the invention, the eighth transistor M8, the ninth transistor M9 and the tenth transistor M10 may be arranged in series between the gate electrode of the seventh transistor M7 and the second power source VSS. In some embodiments of the invention, the eighth transistor M8 may be turned on when the first input bar signal /IN1 has a LOW polarity, the ninth transistor M9 may be turned on when the input bar signal /IN2 has a LOW polarity, and the tenth transistor M1 may be turned on when the third input bar signal /IN3 has a LOW polarity.

Table 1 provides a Truth Table for NAND gates.

TABLE 1

| IN1 | IN2 | IN3 | Vout |
|---|---|---|---|
| 0 | 0 | 0 | 1 |
| 0 | 0 | 1 | 1 |

TABLE 1-continued

| IN1 | IN2 | IN3 | Vout |
|-----|-----|-----|------|
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 0 |

Exemplary operation of the NAND gate illustrated in FIG. 1 will be described below with reference to Table 1. In some embodiments of the invention, any one of the first transistor M1, the second transistor M2 and the third transistor M3 may be turned on when any one of a first input signal IN1, a second input signal IN2, and a third input signal IN3 has a LOW polarity. If any of the first, second and third transistors M1, M2, M3 are on, the first power source VDD and the first electrode of the seventh transistor M7 may be electrically connected to each other, and a voltage of the first power source VDD may be output to an output terminal Vout. Thus, e.g., a voltage of the HIGH polarity may be supplied to the output terminal Vout when one or more of the first input signal IN1, the second input signal IN2 and the third input signal IN3 has a LOW polarity.

Any one of the fourth transistor M4, fifth transistor M5 and sixth transistors M6 may be turned on when one or more of the first input signal IN1, the second input signal IN2 and the third input signal IN3 has a LOW polarity. If any of the fourth, fifth and sixth transistors M4, M5, M6 are on, the first power source VDD and the gate electrode of the seventh transistor M7 may be electrically connected to each other. In such cases, both terminal voltages of a first capacitor C1, which may be arranged between the gate electrode and the first electrode of the seventh transistor M7, may be set to a same voltage value, e.g., the first power source VDD. In some embodiments of the invention, the first capacitor C1 may reduce and/or prevent a leakage current from flowing from the seventh transistor M7 to the second power source VSS by maintaining, and more particularly, e.g., constantly maintaining, a voltage between the gate electrode and the first electrode of the seventh transistor M7.

If any one of the first input signal IN1, the second input signal IN2 and the third input signal IN3 has a LOW polarity, then at least one of the first input bar signal /IN1, the second input bar signal /IN2 and the third input bar signal /IN3 has a HIGH polarity. In such cases, e.g., at least one of the eighth transistor M8, the ninth transistor M9 and the tenth transistor M10 may be turned off, and the gate electrode of the seventh transistor M7 and the second power source VSS may be disconnected, e.g., electrically interrupted.

With regard to the first, second and third transistors M1, M2, M3, the first transistor M1 may be turned off when the first input signal IN1 has a HIGH polarity, the second transistor M2 may be turned off when the second input signal IN2 has a HIGH polarity, and the third transistor M3 may be turned off when the third input signal IN3 has a HIGH polarity. As the first, second and third transistors M1, M2, M3 may be connected in parallel, the first electrode of the seventh transistor M7 may be connected to the first power source VDD if any of the first, second and third input signals IN1, IN2, IN3 has a LOW polarity, and the first electrode of the seventh transistor M7 may be disconnected, e.g., electrically interrupted, from the first power source VDD if all of the first, second and third input signals IN1, IN2, IN3 have a HIGH polarity.

With regard to the fourth, fifth and sixth transistors M4, M5, M6, the fourth transistor M4 may be turned off if the first input signal IN1 has a HIGH polarity, the fifth transistor M5 may be turned off if the second input signal IN2 has a HIGH polarity, and the sixth transistor M6 may be turned off if the third input signal IN3 has a HIGH polarity. Therefore, if, e.g., the first input signal IN1, the second input signal IN2 and the third input signal IN3 all have a HIGH polarity, the first electrode of the seventh transistor M7 and the gate electrode of the seventh transistor M7 may be disconnected from each other, e.g., electrically interrupted.

With regard to the eighth, ninth and tenth transistors M8, M9, M10, the eighth transistor M8 may be turned on if the first input bar signal /IN1 has a LOW polarity, i.e., the first input signal IN1 has a HIGH polarity. The ninth transistor M9 may be turned on if the second input bar signal /IN2 has LOW polarity, i.e., the second input signal IN2 has a HIGH polarity. The tenth transistor M10 may be turned on if the third input bar signal /IN3 has a LOW polarity, i.e., the third input signal IN3 has a HIGH polarity. When the first input bar signal /IN1, the second input bar signal /IN2 and the third input bar signal /IN3 have a LOW polarity, the eighth, ninth and tenth transistors M8, M9, M10 may be turned on and a voltage of the second power source VSS may be supplied to the gate electrode of the seventh transistor M7. If the voltage of the second power source VSS is supplied to the gate electrode of the seventh transistor M7, then the seventh transistor M7 may be turned on, and a voltage of the second power source VSS may be supplied to the output terminal Vout. Thus, e.g., a voltage of the second power source VSS corresponding to the LOW polarity may be output to the output terminal Vout when all of the first input signal IN1, the second input signal IN2 and the third input signal IN3 have a HIGH polarity and accordingly, all of the first input bar signal /IN1, the second input bar signal /IN2 and the third input bar signal /IN3 have a LOW polarity.

As described above, in embodiments of the invention, the NAND gates may be composed of PMOS transistors, i.e., may not include NMOS transistors. By providing NAND gates including only PMOS transistors, the NAND gates may be mounted on a panel of an organic light emitting display, and therefore manufacturing cost may be lowered and the manufacturing process may be simplified.

In the exemplary embodiment of the NAND gate illustrated in FIG. 1, the exemplary NAND gate includes three inputs. However, embodiments of the invention are not limited to three-input NAND gates. For example, NAND gates employing one or more aspects of the invention may include, e.g., two inputs or more than three inputs. The number of the inputs may be controlled by controlling a number of transistors included in each of the first driver 10, the second driver 12 and the third driver 14. For example, if four transistors are included in each of the first driver 10, the second driver 12 and the third driver 14, then NAND gates having four inputs may be configured.

Figure 2:
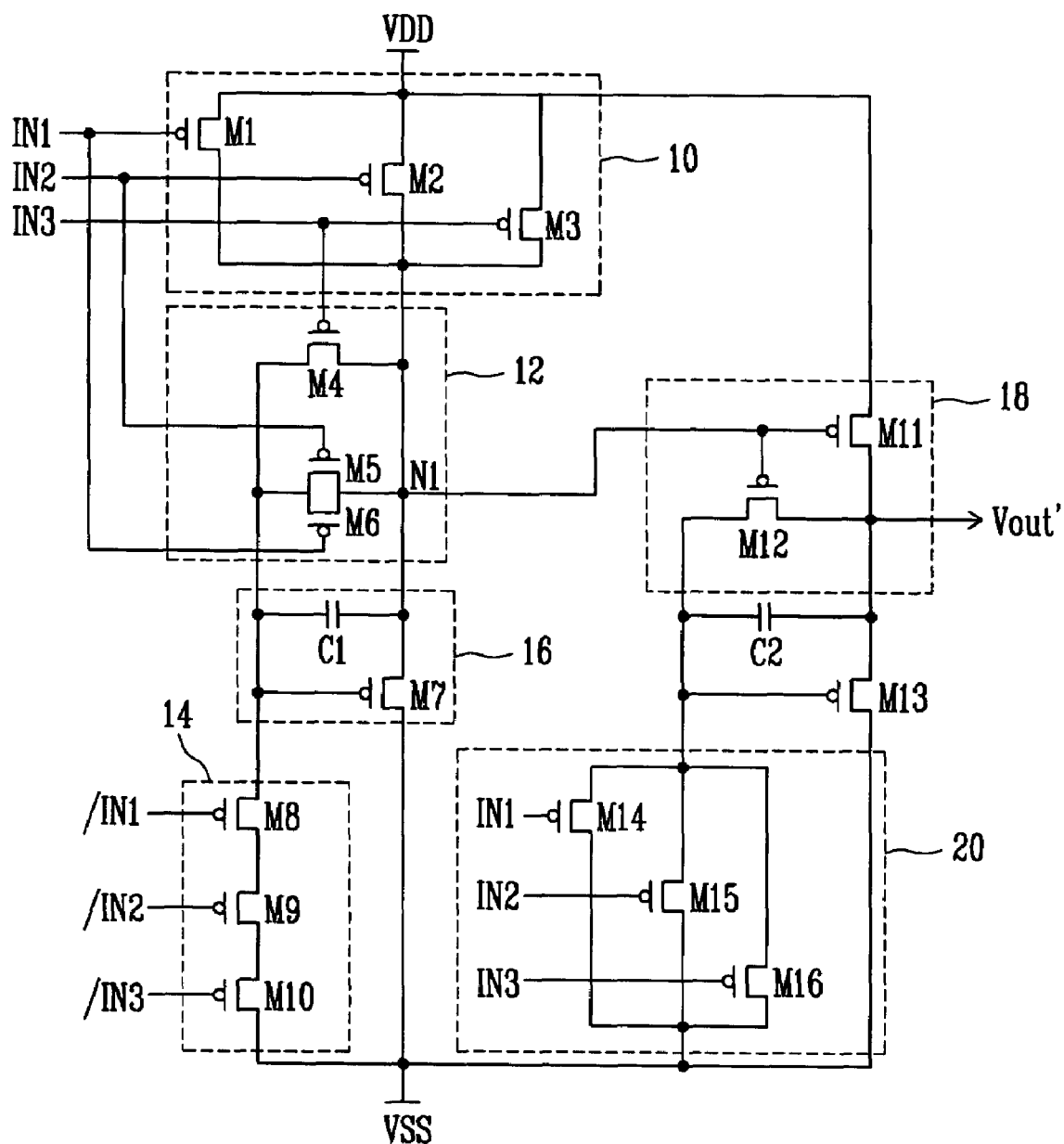
FIG. 2 illustrates a circuit diagram of a first exemplary embodiment of an AND gate according to one or more aspects of the present invention.

FIG. 2 illustrates a circuit diagram of a first exemplary embodiment of an AND gate according to one or more aspects of the present invention. The AND gate according to the first embodiment of the present invention may be realized with PMOS transistors. In the description of FIG. 2, the same parts as in FIG. 1 are assigned to the same reference numerals, and also their descriptions are omitted below.

Referring to FIG. 2, the AND gate according to the first embodiment of the present invention may include a thirteenth transistor M13, i.e., a second control transistor, a first driver 10, a second driver 12, a third driver 14, a fourth driver 16, a fifth driver 18 and a sixth driver 20.

The first driver 10, the second driver 12, the third driver 14 and the fourth driver 16 may be configured in the same manner as shown in FIG. 1. Thus, e.g., the first driver 10 may include the first transistor M1, the second transistor M2 and the third transistor M3, which may all be connected in parallel between a first node N1 and the first power source VDD. The second driver 12 may include the fourth transistor M4, the fifth transistor M5 and the sixth transistor M6, which may all be connected in parallel between the first electrode and the gate electrode of the seventh transistor M7. The third driver 14 may include an eighth transistor M8, a ninth transistor M9 and a tenth transistor M10, which may all be connected in series between the gate electrode of the seventh transistor M7 and the second power source VSS. The fourth driver 16 may include the seventh transistor M7 connected between the first node N1 and the second power source VSS, and the first capacitor C1 connected between the first electrode and the gate electrode of the seventh transistor M7.

The first driver 10, the second driver 12, the third driver 14 and the fourth driver 16 are described in detail above with regard to FIG. 1, and therefore detailed descriptions thereof are omitted below. Additionally, although the above description of the exemplary NAND gate illustrated in FIG. 1 did not refer to "a fourth driver," the first capacitor C1 and the seventh transistor M7 of the exemplary NAND gate may correspond to the fourth driver 16 of the exemplary AND gate shown in FIG. 2. Further, a voltage corresponding to a NAND gate as set forth in Table 1 may be output to the first node N1, i.e., the first electrode of the seventh transistor M7 because the first, second, third and fourth drivers 10, 12, 14 and 16 may be configured in the same manner as that shown in FIG. 1.

Referring to FIG. 2, the thirteenth transistor M13 may be arranged between the first power source VDD and the second power source VSS, and a first electrode of the thirteenth transistor M13 may be connected to an output terminal Vout'. The thirteenth transistor M13 may control a voltage supplied to the output terminal Vout' based on a voltage supplied to the gate electrode of the thirteenth transistor M13, i.e., based on whether the thirteenth transistor M13 is turned on or off. For example, the thirteenth transistor M13 may be turned off when a voltage of the first power source VDD is supplied to the gate electrode of the thirteenth transistor M13, and may be turned on when a voltage of the second power source VSS is supplied to the gate electrode of the thirteenth transistor M13.

The fifth driver 18 may control a connection of the first power source VDD to a first electrode of the thirteenth transistor M13 based on a voltage applied to the first node N1. Thus, the fifth driver 18 may include an eleventh transistor M11 connected between the first electrode of the thirteenth transistor M13 and the first power source VDD, and a twelfth transistor M12 connected between the first electrode of the thirteenth transistor M13 and the gate electrode of the thirteenth transistor M13.

The eleventh transistor M11 and the twelfth transistor M12 may be turned on when a voltage of a LOW polarity is supplied to the first node N1, and may be turned off in other cases. If the eleventh transistor M11 is turned on, then a voltage of the first power source VDD may be supplied to the output terminal Vout'. If the twelfth transistor M12 is turned on, then a voltage of the first power source VDD may be supplied to the gate electrode of the thirteenth transistor M13. Therefore, the voltage of the first power source VDD supplied to the output terminal Vout' may be constantly and/or substantially constantly maintained because the thirteenth transistor M13 may be set to a turned-off state.

The sixth driver 20 may control a connection of the second power source VSS to the gate electrode of the thirteenth transistor M13 based on polarities, e.g., HIGH or LOW, of the first input signal IN1, the second input signal IN2 and the third input signal IN3 in the thirteenth transistor M13. The sixth driver 20 may include a fourteenth transistor M14, a fifteenth transistor M15 and a sixteenth transistor M16, which may all be connected in parallel between the gate electrode of the thirteenth transistor M13 and the second power source VSS.

The fourteenth transistor M14 may be connected between the gate electrode of the thirteenth transistor M13 and the second power source VSS, and may be turned on or turned off by the first input signal IN1. Thus, e.g., the fourteenth transistor M14 may be turned on when the first input signal IN1 has a LOW polarity, and may be turned off in other cases.

The fifteenth transistor M15 may be connected between the gate electrode of the thirteenth transistor M13 and the second power source VSS, and may be turned on or turned off by the second input signal IN2. Thus, e.g., the fifteenth transistor M15 may be turned on when the second input signal IN2 has a LOW polarity, and may be turned off in other cases.

The sixteenth transistor M16 may be connected between the gate electrode of the thirteenth transistor M13 and the second power source VSS, and may be turned on or turned off by the third input signal IN3. Thus, e.g., the sixteenth transistor M16 may be turned on when the third input signal IN3 has a LOW polarity, and may be turned off in other cases.

Table 2 provides a Truth Table for AND gates.

TABLE 2

| IN1 | IN2 | IN3 | Vout |
|-----|-----|-----|------|
| 0 | 0 | 0 | 0 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 1 |

Exemplary operation of the AND gate illustrated in FIG. 2 will be described below with reference to Table 2. A polarity voltage corresponding to an NAND gate may be output to the first node N1. That is, e.g., a voltage of a HIGH polarity may be output to the first node N1 when at least one of the first input signal IN1, the second input signal IN2 and the third input signal IN3 is set to a LOW polarity, and a voltage of a LOW polarity may be output to the first node N1 when all of the input signals, e.g., the first input signal IN1, the second input signal IN2 and the third input signal IN3 have a HIGH polarity.

If a voltage of a HIGH polarity is output into the first node N1, then the eleventh transistor M11 and the twelfth transistor M12 may be turned off. If the eleventh and twelfth transistor M11, M12 are turned off, a voltage of the second power source VSS may be supplied to the gate electrode of the thirteenth transistor M13 and may turn the thirteenth transistor M13 on because any one of the fourteenth transistor M14, the fifteenth M15, and the sixteenth transistors M16 may be turned on. If the thirteenth transistor M13 is turned on, then a voltage of the second power source VSS, i.e., a LOW polarity, may be output to the output terminal Vout'.

If the voltage of a LOW polarity is output to the first node N1, then the eleventh transistor M11 and the twelfth transistor M12 may be turned on. If the eleventh transistor M11 and the twelfth transistor M12 are turned on, then the thirteenth transistor M13 may be turned off, and therefore the first power source VDD, i.e., a HIGH polarity, may be output to the output terminal Vout'. A voltage of the output terminal Vout' may be constantly and/or substantially constantly maintained because the fourteenth transistor M14, the fifteenth transistor M15 and the sixteenth transistor M16 may be turned off when a voltage of the LOW polarity is output to the first node N1. The second capacitor C2 may prevent and/or reduce a leakage current from flowing in the thirteenth transistor M13 by charging a voltage between the first electrode of the thirteenth transistor M13 and the gate electrode of the thirteenth transistor M13.

As described above, AND gates according to the first embodiment of the present invention may be composed of PMOS transistors, i.e., may not include any NMOS transistors. Accordingly, the AND gates according to the first embodiment of the present invention may be mounted on a panel, and therefore the manufacturing cost may be lowered and/or the manufacturing process may be simplified.

In the exemplary embodiment of the AND gate illustrated in FIG. 2, the exemplary AND gate includes three inputs. However, embodiments of the invention are not limited to three-input AND gates. For example, AND gates employing one or more aspects of the invention may include, e.g., two inputs or more than three inputs. The number of the inputs may be controlled by controlling a number of transistors included in each of the first driver 10, the second driver 12, the third driver 14, and/or the sixth driver 20. For example, if four transistors are included in each of the first driver 10, the second driver 12, the third driver 14, and the sixth driver 20, then AND gates having four inputs may be configured.

Figure 3:
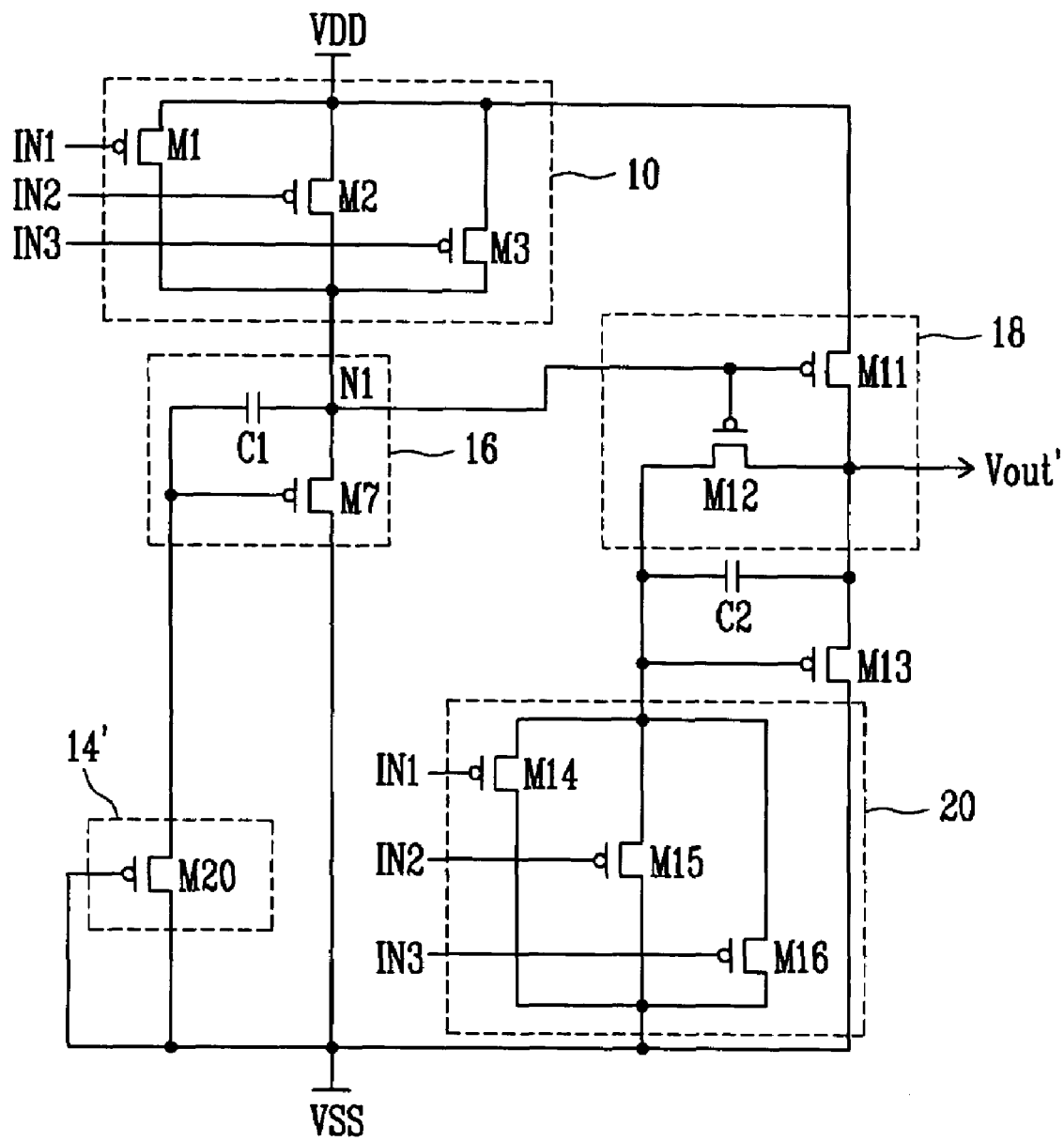
FIG. 3 illustrates a circuit diagram of a second exemplary embodiment of an AND gate according to one or more aspects of the present invention.

FIG. 3 illustrates a circuit diagram of a second exemplary embodiment of an AND gate according to one or more aspects of the present invention. In description of FIG. 3, the same parts as in FIG. 2 are assigned to the same reference numerals, and also their descriptions are omitted below.

Referring to FIG. 3, an AND gate according to the second embodiment of the present invention may include the thirteenth transistor M13, the first driver 10, a third driver 14', the fourth driver 16, the fifth driver 18 and the sixth driver 20. As shown in FIG. 3, the first driver 10, the fourth driver 16, the fifth driver 18 and the sixth driver 20 may be configured in the same manner as shown in FIG. 2.

According to the second exemplary embodiment of an AND gate, the third driver 14' may enable a voltage of the first power source VDD to be maintained at the first node N1 when the voltage of the first power source VDD is supplied to the first node N1, and may enable a voltage of the second power source VSS to be maintained at the first node N1 in other cases. The third driver 14' may include a twentieth transistor M20 connected between the gate electrode of a seventh transistor M7 and the second power source VSS. According to the second exemplary embodiment of the AND gate, the second driver 12 of the first exemplary AND gate illustrated in FIG. 2 may be omitted.

A first electrode of the twentieth transistor M20 may be connected to the gate electrode of the seventh transistor M7, and a gate electrode and a second electrode of the twentieth transistor M20 may be connected to the second power source VSS. Thus, e.g., in some embodiments of the invention, the twentieth transistor M20 may be diode-connected to maintain a voltage of the gate electrode of the seventh transistor M7 at about a voltage of the second power source VSS.

If the first power source VDD and the first node N1 are disconnected, i.e., electrically interrupted, by the first driver 10, then the seventh transistor M7 may maintain a voltage of the first node N1 at a LOW polarity, i.e., the second power source VSS voltage, while maintaining a turned-on state. If the first power source VDD and the first node N1 are electrically connected to each other by the first driver 10, then the seventh transistor M7 may maintain a voltage of the first node N1 at a HIGH polarity, e.g., a first power source VDD voltage. Thus, e.g., a width/length ratio W/L of the seventh transistor M7 may be set to a narrower range than that of each of the first transistor M1, the second transistor M2 and the third transistor M3.

When a voltage of the first power source VDD is supplied to the first node N1 when any one of the first, second and/or third transistors M1, M2, M3 are on, a voltage of the first power source VDD may be constantly or substantially constantly maintained at the first node N1. In some embodiments of the invention, a voltage of the gate electrode of the seventh transistor M7 may be controlled using only the third driver 14' of the second embodiment of the present invention. Thus, according to the second exemplary embodiment of the AND gate, the second driver 12 of the first exemplary AND gate shown in FIG. 2 may be omitted.

Figure 4:
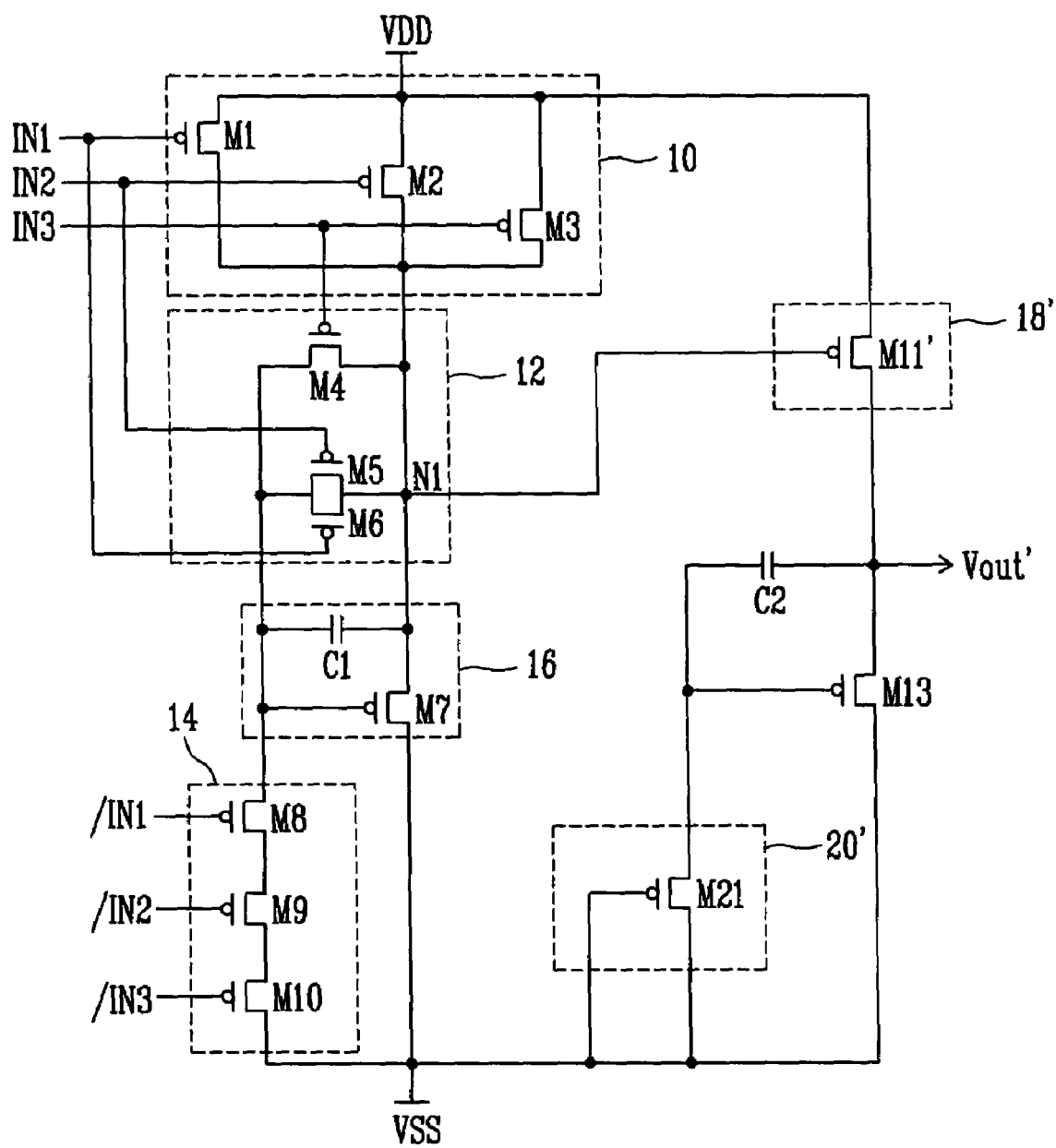
FIG. 4 illustrates a circuit diagram of a third exemplary embodiment of an AND gate according to one or more aspects of the present invention.

FIG. 4 illustrates a circuit diagram of a third exemplary embodiment of an AND gate according to one or more aspects of the present invention. In the description of FIG. 4, the same parts as in FIG. 2 may be assigned to the same reference numerals, and also their descriptions are omitted herein.

Referring to FIG. 4, the AND gate according to the third embodiment of the present invention may include the thirteenth transistor M13, the first driver 10, the second driver 12, the third driver 14, the fourth driver 16, a fifth driver 18' and a sixth driver 20'. As shown in FIG. 4, the first driver 10, the second driver 12, the third driver 14, and the fourth driver 16 may be configured in the same manner as shown in FIG. 2.

The fifth driver 18' may control a connection of the first electrode of the thirteenth transistor M13 to the first power source VDD based on a voltage of the first node N1. Thus, e.g., the fifth driver 18' may be arranged between the first power source VDD and the first electrode of the thirteenth transistor M13. The fifth driver 18' may include an eleventh transistor M11' and a gate electrode thereof may be connected to the first node N1.

The sixth driver 20' may enable a voltage of the first power source VDD to be maintained at the output terminal Vout' when a voltage of the first power source VDD is supplied to the first electrode, i.e., the output terminal Vout', of the thirteenth transistor M13, and may enable a voltage of the second power source VSS to be maintained at the output terminal Vout' in other cases. The sixth driver 20' may include a twenty-first transistor M21, which may be connected between the gate electrode of the thirteenth transistor M13 and the second power source VSS.

A first electrode of the twenty-first transistor M21 may be connected to the gate electrode of the thirteenth transistor M13, and a gate electrode and a second electrode of the twenty-first transistor M21 may be connected to the second power source VSS. Thus, e.g., the twenty-first transistor M21 may be diode-connected to maintain a voltage of the gate electrode of the thirteenth transistor M13 at about a voltage of the second power source VSS.

During operation of the third exemplary AND gate illustrated in FIG. 4, the thirteenth transistor M13 may maintain a turned-on state by the twenty-first transistor M21. Accordingly, the second power source VSS voltage may be output to the output terminal Vout' when the first node N1 is set to a HIGH polarity and the eleventh transistor M11 is turned off.

In some embodiments of the invention, the eleventh transistor M11 may be turned on when the first node N1 is set to a LOW polarity, and therefore a voltage of the first power source VDD may be supplied to the output terminal Vout'. In such cases, the thirteenth transistor M13 may maintain a voltage of the output terminal Vout' at the first power source VDD voltage. In some embodiments of the invention, a width/length ratio (W/L) of the thirteenth transistor M13 may be set to a narrower range than that of the eleventh transistor M11. Therefore, a voltage of the first power source VDD may be constantly or substantially constantly maintained when the first power source VDD voltage is supplied to the output terminal Vout'.

Figure 5:
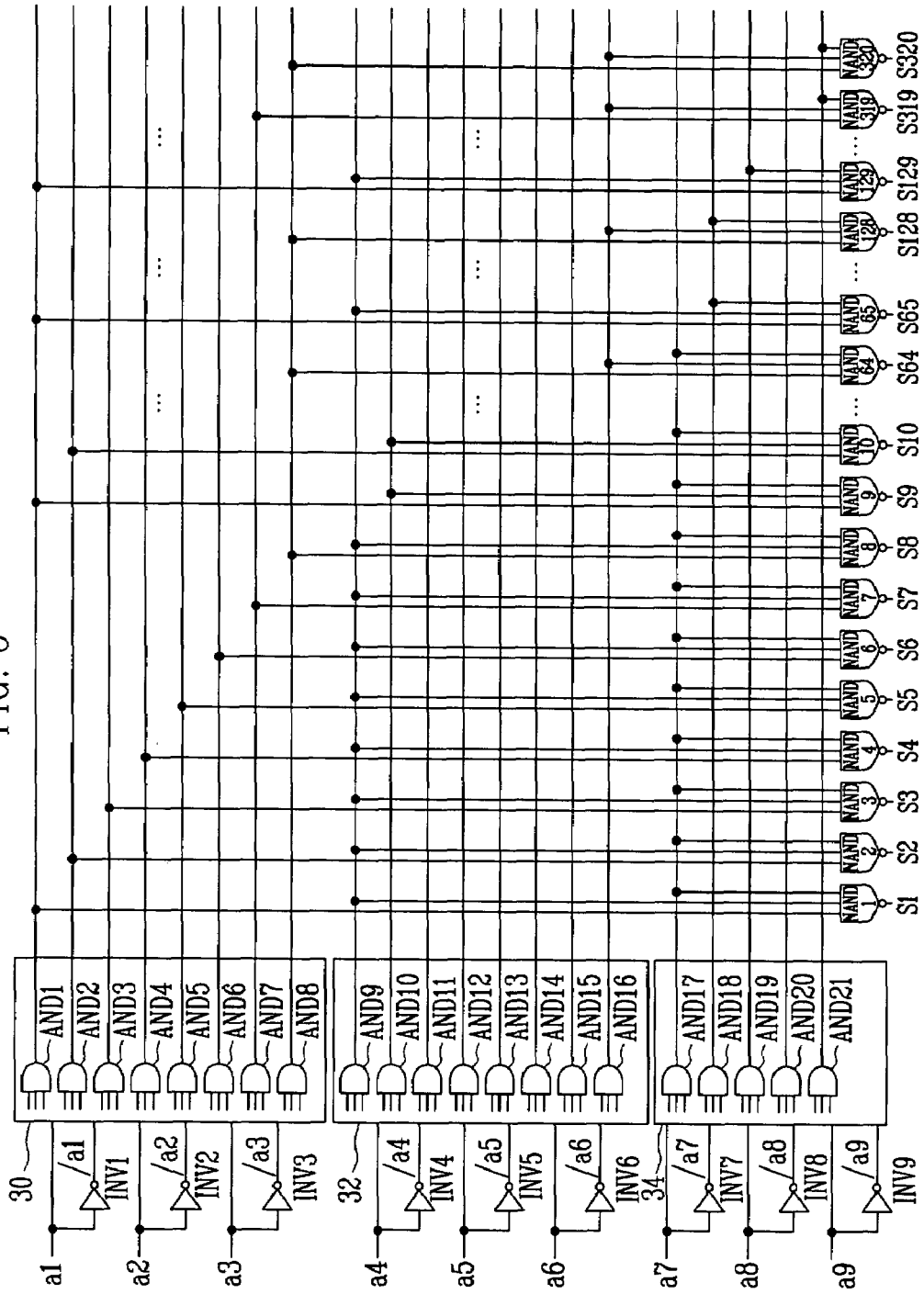
FIG. 5 illustrates a circuit diagram of a scan driver including the exemplary AND gate illustrated in FIG. 4 and the exemplary NAND gate illustrated in FIG. 1.

FIG. 5 illustrates a circuit diagram of a scan driver including the exemplary AND gate illustrated in FIG. 4 and the exemplary NAND gate illustrated in FIG. 1. In the following description, it is assumed that a scan driver is connected to 320 scan lines S1 to S320, and scan signals are also sequentially supplied to the scan lines S1 to S320 shown in FIG. 5. However, embodiments of the invention are not limited to such an embodiment. For example, in embodiments of the invention, a scan driver may be connected to more than or less than 320 scan lines.

Referring to FIG. 5, the scan driver of the present invention may include a plurality of decoders 30, 32, 34, and NAND gates NAND1 to NAND320. The NAND gates NAND1 to NAND 320 may generate scan signals by performing an NAND operation on outputs of the decoders 30, 32, 34.

The first decoder 30 and the second decoder 32 may include, e.g., three input terminals and eight output terminals, and the third decoder 34 may include, e.g., three input terminals and five output terminals. In such embodiments, the first decoder 30 and the second decoder 32 may each include eight AND gates and the third decoder 34 may include five AND gates. A number of the AND gates included in each of the decoders 30, 32, 34 may be determined depending on the number of the scan lines, e.g., S1 to S320, connected to the scan driver. For example, in the exemplary embodiment of the scan driver illustrated in FIG. 5, twenty one AND gates may be included in the scan driver and the AND gates may respectively supply a scan signal to the 320 scan lines S1 to S320.

The first decoder 30 may include eight AND gates AND1 to AND8. Input signals and input bar signals may be supplied to each of the AND gates AND1 to AND8. For example, the input signals may be supplied from a first input terminal a1, a second input terminal a2 and a third input terminal a3, and the input bar signals may be supplied from a first inverter INV1 connected to the first input terminal a1, a second inverter INV2 connected to the second input terminal a2, and a third inverter INV3 connected to the third input terminal a3. The input signals and the input bar signals that may be supplied to the AND gates AND1 to AND8 will be described in detail below.

The second decoder 32 may include eight AND gates AND9 to AND16. Input signals and input bar signals may be supplied to each of the AND gates AND9 to AND16. The input signals may be supplied from a fourth input terminal a4, a fifth input terminal a5, and a sixth input terminal a6. The input bar signals may be supplied from a fourth inverter INV4 connected to the fourth input terminal a4, a fifth inverter INV5 connected to the fifth input terminal a5, and a sixth inverter INV6 connected to the sixth input terminal a6. The input signals and the input bar signals that may be supplied to the AND gates AND9 to AND16 will be described in detail below.

The third decoder 34 may include five AND gates AND17 to AND21. Input signals and input bar signals may be supplied to each of the AND gates AND17 to AND21. The input signals may be supplied from a seventh input terminal a7, an eighth input terminal a8 and a ninth input terminal a9. The input bar signals may be supplied from a seventh inverter INV7 connected to the seventh input terminal a7, an eighth inverter INV8 connected to the eighth input terminal a8, and a ninth inverter INV9 connected to the ninth input terminal a9. The input signals and the input bar signals supplied to the AND gates AND17 to AND21 will be described in detail below.

Each of the NAND gates NAND1 to NAND320 may receive output signals from the first decoder 30, the second decoder 32 and the third decoder 34, and may respectively output signals obtained from NAND operations to the scan lines S1 to S320.

For example, the first NAND gate NAND1 may supply the scan signals to the first scan line S1 by performing a NAND operation on outputs of the first AND gate AND1, the ninth AND gate AND9 and the seventeenth AND gate AND17. The second NAND gate NAND2 may supply the scan signals to the second scan line S2 by performing a NAND operation on outputs of the second AND gate AND2, the ninth AND gate AND9, and the seventeenth AND gate AND17. The sixty-fourth NAND gate NAND64 may supply the scan signals to the sixty-fourth scan line S64 by performing a NAND operation on outputs of the eighth AND gate AND8, the sixteenth AND gate AND16, and the seventeenth AND gate AND17. The three-hundred-twentieth NAND gate NAND320 may supply the scan signals to the three-hundred-twentieth scan line S320 by performing a NAND operation on outputs of the eighth AND gate AND8, the sixteenth AND gate AND16 and the twenty-first AND gate AND21. Thus, e.g., in some embodiments of the invention, each of the NAND gates NAND1 to NAND320 may supply the scan signals to one of the scan lines, e.g., one of scan lines S1 to S320, by performing a NAND operation on outputs of the decoders 30, 32, 34.

Figure 6:
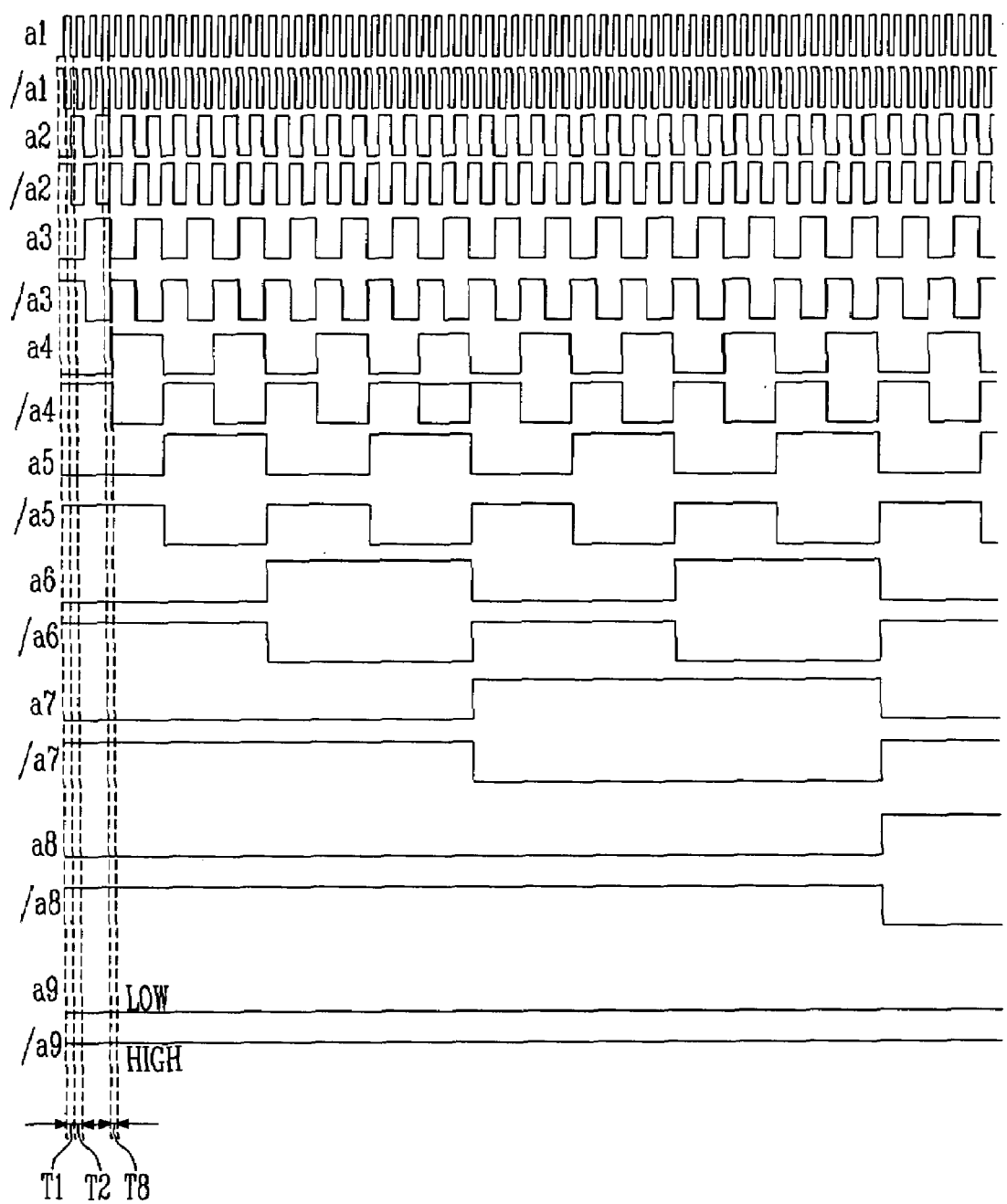
FIG. 6 illustrates a waveform diagram of exemplary driving waveforms that may be supplied to the input terminals of the exemplary scan driver illustrated in FIG. 5.

FIG. 6 illustrates a waveform diagram of exemplary driving waveforms that may be supplied to the input terminals of the exemplary scan driver illustrated in FIG. 5.

Referring to FIG. 6, driving waveforms having different frequencies may be supplied to the input terminals a1 to a9. For example, the frequencies of the driving waveforms supplied to the first to ninth input terminals a1 to a9 may decrease by one-half for each subsequent input terminal. That is, e.g., the frequencies of the driving waveforms supplied to the ninth input terminal a9 to the first input terminal a1 may double from the ninth input terminal a9 to first input terminal a1. More particularly, e.g., a frequency of the driving waveform supplied to the eighth input terminal a8 may be two-times a frequency of a driving waveform supplied to the ninth input terminal a9, and a frequency of the driving waveform supplied to the seventh input terminal a7 may be two-times the frequency of the driving waveform supplied to the eighth input terminal a8. Further, e.g., a frequency of the driving waveform supplied to the sixth input terminal a6 may be two-times the frequency of the driving waveform supplied to the seventh input terminal a7, and a frequency of the driving waveform supplied to the fifth input terminal a5 may be two-times the frequency of the driving waveform supplied to the sixth input terminal a6.

In some embodiments of the invention, a parasitic capacitance of a line wire may be reduced and/or minimized by arranging the decoders 30, 32, 34 based on frequencies of driving waveforms to be supplied thereto. For example, a parasitic capacitance and a resistance may be reduced by arranging the decoder receiving the relatively fastest frequency adjacent to the NAND gates NAND1 to NAND320, and therefore a response time may be improved.

Figure 7:
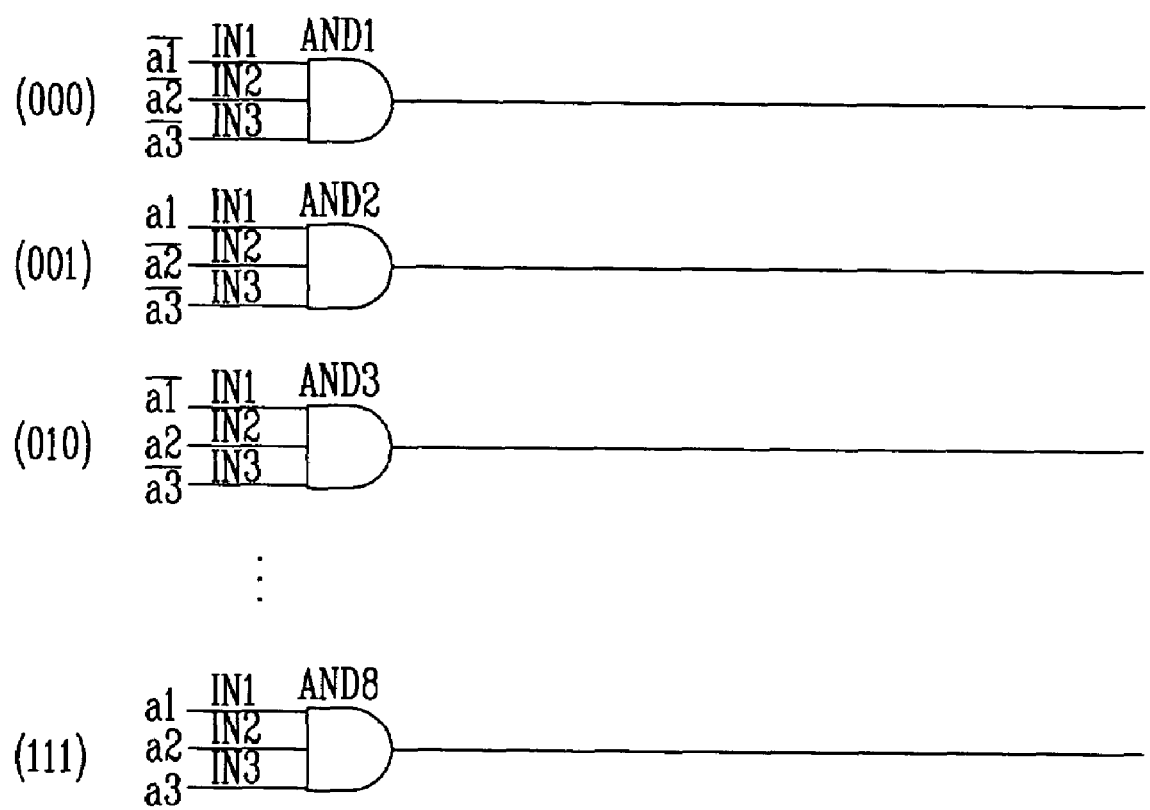
FIG. 7 illustrates a diagram of exemplary connection configurations of input terminals of the AND gates of the exemplary first decoder of the exemplary scan driver illustrated in FIG. 5.
Figure 8A:
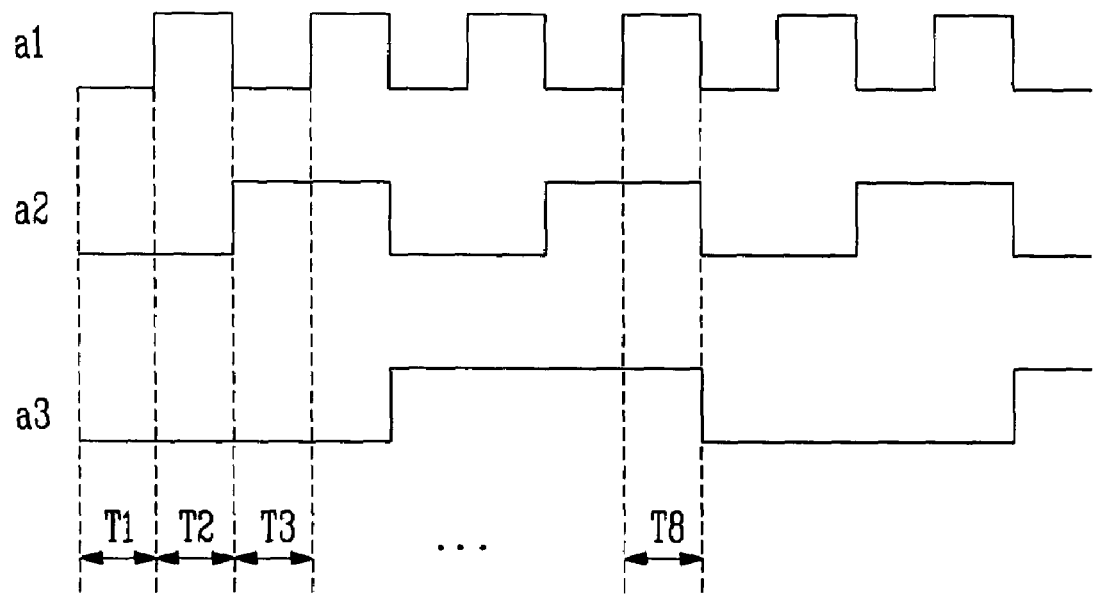
FIG. 8A illustrates enlarged waveform diagrams of the first, second and third input signals illustrated in FIG. 6.
Figure 8B:
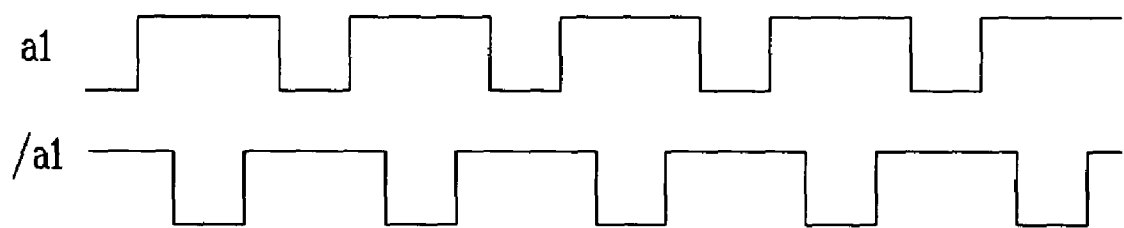
FIG. 8B illustrates enlarged waveform diagrams of the first input signal and the first input bar signal illustrated in FIG. 6.

FIG. 7 illustrates a diagram of exemplary connection configurations of input terminals of the AND gates of the exemplary first decoder 30 of the exemplary scan driver illustrated in FIG. 5. FIG. 8A illustrates enlarged waveform diagrams of the first, second and third input signals illustrated in FIG. 6, which may be supplied to the first, second and third input terminals a1, a2, a3. FIG. 8B illustrates enlarged waveform diagrams of the first input signal and the first input bar signal illustrated in FIG. 6, which may be supplied to the first input terminal a1 and the first input bar terminal /a1.

More particularly, FIG. 7 illustrates an exemplary connection configuration of the first input terminal a1, the second input terminal a2, the third input terminal a2, the first input bar terminal /a1, the second input bar terminal /a2, and the third input bar terminal /a3 for supplying respective first, second, and third input signals IN1, IN2, IN3 to each of the AND gates AND1 to AND8 of the first decoder 30. Embodiments of the invention are not limited to the exemplary connection configuration illustrated in FIG. 7. Also, a connection configuration of the ninth to sixteenth AND gates AND9 to AND16 included in the second decoder 32 and the seventeenth to twenty-first and gates AND17 to AND21 included in the third decoder 34 may also designed in the same manner as described with regard to the first decoder 30 except for the respective input terminals and/or input bar terminals, e.g., a4 to a9 and /a4 to /a9, to be connected.

Thus, e.g., in some embodiments of the invention, a ninth AND gate AND9 of the second decoder 32 may be connected to the fourth input bar terminal /a4, the fifth input bar terminal /a5, and the sixth input bar terminal /a6 while, as shown in FIG. 7, the first AND gate AND1 of the first decoder 30 may be connected to the first input bar terminal /a1, the second input bar terminal /a2, and the third input bar terminal /a3. Similarly, e.g., the seventeenth AND gate AND17 of the third decoder 34 may be connected to the seventh input bar terminal /a7, the eight input bar terminal /a8, and the ninth input bar terminal /a9.

Referring to FIGS. 5 and 7, in order to sequentially output scan signals, the first AND gate AND1 to the eighth AND gate AND8 may sequentially output signals of a LOW polarity. Thus, e.g., the first AND gate AND1 may receive a first driving signal supplied from the first input bar terminal /a1 as the first input signal IN1 of the first and gate AND1, a second driving signal supplied from the second input bar terminal /a2 as the second input signal IN2 of the first and gate AND1, and a third driving signal supplied from the third input bar terminal /a3 as the third input signal IN3 of the first and gate AND1. In such embodiments, a driving signal of the first input terminal a1 may be used for the first input bar signal /IN1 of the first AND gate AND1, a driving signal of the second input terminal a2 may be used for the second input bar signal /IN2 of the first AND gate AND1, and a driving signal of third input terminal a3 may be used for the third input bar signal /IN3 of the first AND gate AND1.

In FIG. 7, the numbers in the parentheses correspond to polarities of each of the polarities of the first, second and third terminals a1, a2, a3 that may result in the respective AND gate to output a voltage of a HIGH polarity, i.e., when all three input signals IN1, IN2, IN3 of the respective AND gate have a high polarity, based on the respective connections of each of the AND gates AND1 to AND8. More particularly, e.g., (001) shown in FIG. 7 corresponding to the second AND gate AND2 may correspond to a voltage of a HIGH polarity being supplied by the first input terminal a1 as the first input signal IN1 of the second AND gate AND2, a voltage of a HIGH polarity being supplied by the second input bar terminal /a2 as the second input signal IN2 of the second AND gate AND2, and a voltage of a HIGH polarity being supplied by the third input bar terminal /a3 as the third input signal IN3 of the third AND gate AND3.

Referring to FIG. 8A, during a first period T1, the first, second and third input terminals a1, a2, a3 may have a LOW polarity. Thus, during the first period T1, the first, second and third bar input terminals /a1, /a2, /a3 may have a HIGH polarity. Therefore, during the first period T1, a HIGH polarity may be output from the first AND gate AND1.

As discussed above, in some embodiments of the invention, the ninth to sixteenth AND gates AND9 to AND16 of the second decoder 32 and the seventeenth to twenty-first AND gates AND17 to AND21 of the third decoder 34 may have a similar configuration as the first to eighth AND gates AND1 to AND8 of the first decoder 30. In such cases, e.g., during the first period T1, a voltage of a HIGH polarity may be output from the ninth AND gate AND9 because the fourth input bar signal /a4, the fifth input bar signal /a5 and the sixth input bar signal /a6 may have a HIGH polarity during the first period T1. Also, in such cases, e.g., during the first period T1, a voltage of the HIGH polarity may be output from the seventeenth AND gate AND17 because the seventh input bar signal /a7, the eighth input bar signal /a8 and the ninth input bar signal /a9 may have a HIGH polarity during the first period T1.

In such cases, referring to FIGS. 5 and 7, a signal of the LOW polarity, i.e., a scan signal, may be output from the first NAND gate NAND1 connected to the first AND gate AND1, the ninth AND gate AND9, and the seventeenth AND gate AND17. Thus, e.g., during the first period T1, the respective scan signal may output by the first NAND gate NAND1 to the first scan line S1.

Referring to FIG. 7, the second AND gate AND2 may receive a first driving signal supplied from the first input terminal a1 as the first input signal IN1 of the second AND gate AND2, a second driving signal supplied from the second input bar terminal /a2 as the second input signal IN2 of the second AND gate AND2, and a third driving signal supplied from the third input bar terminal /a3 as the third input signal IN3. In such embodiments, a driving signal of the first input bar terminal /a1 may be used for the first input bar signal /IN1 of the second AND gate AND2, the driving signal of the second input terminal a2 may be used for the second input bar signal /IN2 of the second AND gate AND2, and the driving signal of the third input terminal a3 may be used for the third input bar signal /IN3 of the second AND gate AND2.

Referring to FIG. 8A, during a second period T2, the first input terminal a1 may have a HIGH polarity, and the second and third input terminals a2, a3 may have a LOW polarity. Thus, during the second period T2, the first input bar terminal /a1 may have a LOW polarity, and the second and third input bar terminals /a2, /a3 may have a HIGH polarity. Therefore, as a result of the first input terminal a1, the second input bar terminal /a2 and the third input bar terminal /a3, which may all have a HIGH polarity during the second period T2, all three input signals IN1, IN2, IN3 of the second AND gate AND2 may have a voltage of a HIGH polarity. Thus, during the second period T2, a voltage of a HIGH polarity may be output from the second AND gate AND2.

As discussed above, in some embodiments of the invention, the ninth to sixteenth AND gates AND9 to AND16 of the second decoder 32 and the seventeenth to twenty-first AND gates AND17 to AND21 of the third decoder 34 may have a similar configuration as the first to eighth AND gates AND1 to AND8 of the first decoder 30. In such cases, e.g., during the second period T2, a voltage of a HIGH polarity may be output from the ninth AND gate AND9 because the fourth input bar signal /a4, the fifth input bar signal /a5 and the sixth input bar signal /a6 may have a HIGH polarity during the second period T2. Also, in such cases, e.g., during the second period T2, a voltage of the HIGH polarity may be output from the seventeenth AND gate AND17 because the seventh input bar signal /a7, the eighth input bar signal /a8 and the ninth input bar signal /a9 may have a HIGH polarity during the second period T2.

In such cases, referring to FIGS. 5 and 7, a signal of the LOW polarity, i.e., a scan signal, may be output from the second NAND gate NAND2 connected to the second AND gate AND2, the ninth AND gate AND9, and the seventeenth AND gate AND17. Thus, e.g., during the second period T2, the respective scan signal may be output by the second NAND gate NAND2 to the second scan line S2.

Also, e.g., the eighth AND gate AND8 may receive a first driving signal supplied from the first input terminal a1 as the first input signal IN1 of the eighth AND gate AND8, a second driving signal supplied from the second input terminal a2 as the second input signal IN2 of the eighth AND gate AND8, and a third driving signal supplied from the third input terminal a3 as the respective third input signal IN3 of the eighth AND gate AND8. In such embodiments, a driving signal of the first input bar terminal /a1 may be used for the first input bar signal /IN1 of the eighth AND gate AND8, the driving signal of the second input bar terminal /a2 may be used for the second input bar signal /IN2 of the eighth AND gate AND8, and the driving signal of the third input bar terminal /a3 may be used for the third input bar signal /IN3 of the eighth AND gate AND8.

Referring to FIG. 8A, during an eighth period T8, the first, second and third input terminals a1, a2, a3 may have a HIGH polarity. Therefore, as a result of the first, second and third input bar terminals /a1, /a2, /a3 having a HIGH polarity during the eighth period T8, a voltage of a HIGH polarity may be output from the eighth AND gate AND8 during the eighth period T8.

As discussed above, in some embodiments of the invention, the ninth to sixteenth AND gates AND9 to AND16 of the second decoder 32 and the seventeenth to twenty-first AND gates AND17 to AND21 of the third decoder 34 may have a similar configuration as the first to eighth AND gates AND1 to AND8 of the first decoder 30. In such cases, e.g., during the eighth period T8, a voltage of a HIGH polarity may be output from the ninth AND gate AND9 because the fourth input bar signal /a4, the fifth input bar signal /a5 and the sixth input bar signal /a6 may have a HIGH polarity during the second period T2. Also, in such cases, e.g., during the eighth period T8, a voltage of the HIGH polarity may be output from the seventeenth AND gate AND17 because the seventh input bar signal /a7, the eighth input bar signal /a8 and the ninth input bar signal /a9 may have a HIGH polarity during the eighth period T8.

In such cases, referring to FIGS. 5 and 7, a signal of the LOW polarity, i.e., a scan signal, may be output from the eighth NAND gate NAND8 connected to the eighth AND gate AND8, the ninth AND gate AND9, and the seventeenth AND gate AND17. Thus, e.g., during the eighth period T8, the respective scan signal may output by the eighth NAND gate NAND8 to the eighth scan line S8.

In the exemplary method described above, the scan driver employing one or more aspect of the present invention may sequentially supply a scan signal to the scan lines S1 to S320. Embodiments of the invention provide scan drivers including AND gates, e.g., AND1 to AND21, composed of PMOS transistors, i.e., the AND gates do not include NMOS transistors, and NAND gates, e.g., NAND1 to NAND320, composed of PMOS transistors, i.e., the NAND gates do not include NMOS transistors. Thus, embodiments of the invention, may enable a scan driver to be mounted on a panel of an organic light emitting display.

FIG. 5 illustrates an exemplary connection configuration for the scan driver in which the scan signals may be sequentially supplied to the scan lines S1 to S320. However, embodiments of the invention are not limited thereto. For example, to compensate for a voltage deviation of pixels in an organic light emitting display, a method for driving an organic light emitting display in a digital mode has recently been proposed. In digital mode, a predetermined image may be displayed by supplying data signal(s) of "1" or "0" and controlling an emission time of each pixel.

If such a digital mode is driven with classified subframe units, problems such as, e.g., contour noise, may be generated. Accordingly, a method of supplying scan signals in a non-sequential manner has been proposed. According to such a method, e.g., non-emission time may be reduced to reduce and/or eliminate contour noise by supplying a scan signal is supplied to one of the scan lines, e.g., the tenth scan line S10, and then supplying a scan line to another scan line that does not immediately precede or follow the tenth scan line S10. That is, e.g., after supplying a scan line to the tenth scan line S10, a scan signal may be supplied to the sixtieth scan line S60, but not to the eleventh scan line S11. In such cases, a scan driver employing one or more aspects of the present invention may supply the scan signal to any of the scan lines by changing the driving waveform shown in FIG. 6 and/or the connection configuration shown in FIG. 5.

For example, the first NAND gate NAND1 may be connected to the tenth scan line S10, and the second NAND gate NAND2 may be connected to the sixtieth scan line S60. Thus, e.g., in some embodiments of the invention, a scan signal may be supplied to a position appointed for supplying the respective scan signal by changing connection positions of the first NAND gates NAND1 to NAND320, and therefore, the scan signals may be easily subjected to a digital driving scheme.

Referring to FIG. 8B, in some embodiments of the invention, driving waveforms supplied to, e.g., input terminals a1 to a9 of a scan driver, may have longer periods for HIGH polarity portions than LOW polarity portions.

More specifically, e.g., referring to FIG. 8B, the HIGH polarity portions may be set to a longer period than the LOW polarity portions of the driving waveforms supplied to the first input terminal a1 and the first input bar terminal /a1, respectively. In such cases, the driving waveform supplied to the first input bar terminal (/a1) may not be generated by an inverter, e.g., INV1, but may be externally supplied. As described above, by providing driving waveforms in which a setting the HIGH polarity portion(s) is longer period than the LOW polarity portion(s), then overlap of the LOW polarity portions and the HIGH polarity portions may be reduced and/or eliminated as a result of a delay and, therefore, stable driving may be ensured.

Figure 9:
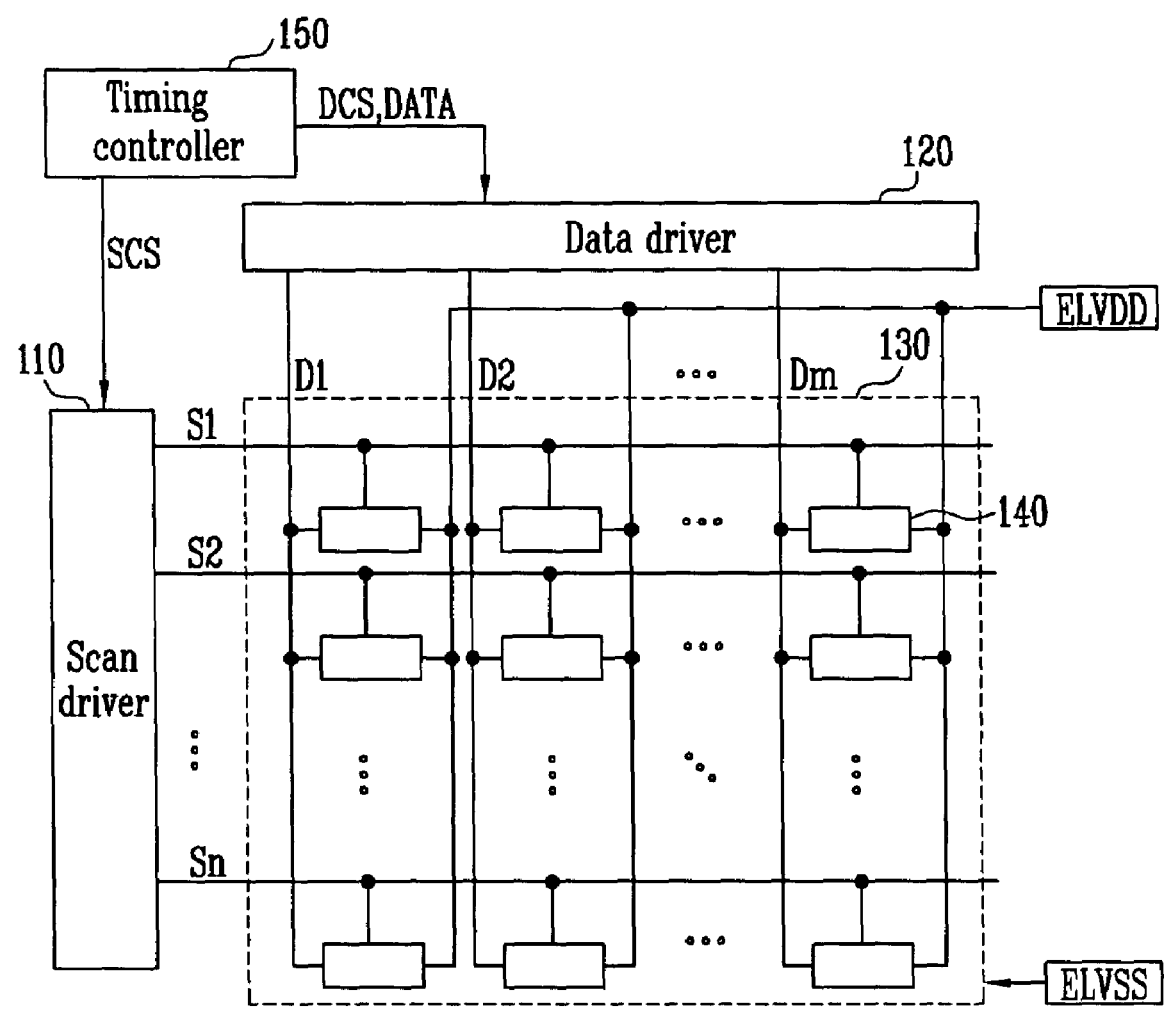
FIG. 9 illustrates a schematic diagram of an organic light emitting display according to one or more embodiments of the present invention.

FIG. 9 illustrates a schematic diagram of an organic light emitting display (OLED) according to one or more embodiments of the present invention. The exemplary OLED may include a pixel unit 130, a scan driver 110, a data driver 120 and a timing controller 150. The pixel unit 130 may include pixels 140 formed at intersecting portions of scan lines S1 to Sn and data lines D1 to Dm. The scan driver 110 may drive the scan lines S1 to Sn. The data driver 120 may driver the data lines D1 to Dm. The timing controller 150 may control the scan driver 110 and the data driver 120.

The data driver 120 may generate data signals in response to a data driving control signal DCS supplied from a timing controller 150, and may supply the generated data signals DATA to the data lines D1 to Dm. During every horizontal period 1H, the data driver 120 may supply, to the data lines D1 to Dm, the data signals corresponding to the pixels 140 associated with a respective one of the scan lines S1 to Sn.

The scan driver 110 may generate scan signals based on a scan driving control signal SCS, e.g., a driving waveform as shown in FIG. 6, supplied from the timing controller 150, and may supply the generated scan signals to the respective scan lines (S1 to Sn). The scan signals generated in the scan driver 110 may be randomly or sequentially supplied to the scan lines S1 to Sn. The scan driver 110 may include a plurality of AND gates and/or a plurality of NAND gates composed of PMOS transistors, i.e., contain no NMOS transistors, as shown in FIG. 5. As discussed above, the scan driver 110, which may employ only PMOS transistors for AND and/or NAND gates may be formed on a panel of the display and may thereby enable the manufacturing cost to be reduced and/or the manufacturing process to be simplified.

In embodiments of the invention, to reduce a mounting area of a panel, decoders, e.g., 30, 32, 34, which may be included in the scan driver 110, may be formed on the data driver 120 in the form of an integrated circuit. Thus, e.g., the decoders, e.g., 30, 32, 34 may be fabricated along with the data driver 120. Thus, the scan driver 110 may be stably driven by electrically connecting the decoders 30, 32, 34 to the NAND gates formed on the panel.

The timing controller 150 may generate data driving control signal(s) DCS and scan driving control signals SCS corresponding to synchronizing signals supplied from the outside. The data driving control signals DCS generated in the timing controller 150 may be supplied to the data driver 120, and the scan driving control signals SCS may be supplied to the scan driver 110. The timing controller 150 may rearrange externally supplied data and may supply the externally supplied data to the data driver 120.

The pixel unit 130 may receive a first external driving power source ELVDD and a second external driving power source ELVSS, and may supply the first driving power source ELVDD and the second driving power source ELVSS to each of the pixels 140. The pixels 140 may receive the first driving power source ELVDD and the second driving power source ELVSS based on the data signal(s) and may thereby control an electric current flowing from the first driving power source ELVDD to the second driving power source ELVSS via an organic light emitting diode.

As described above, logic gate(s) according to one or more aspects of the present invention, and scan driver(s) and/or organic light emitting display(s) using such logic gate(s) may be advantageous for providing scan driver(s) employing NAND gate(s) and AND gate(s) composed of PMOS transistors, i.e., not including NMOS transistors. In such cases, it is possible to mount a scan driver on a panel without increasing a number of masks because all the transistors in the scan driver may be PMOS transistors, i.e., no NMOS transistors. Therefore, embodiments of the invention may also enable manufacturing costs to be reduced. Also, scan drivers according to one or more aspects of the present invention may set up an order of the scan signals supplied to the scan lines in various ways by varying driving waveform(s) and/or connections between the logic gates and may therefore be easily applicable to various driving processes.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A logic gate electrically connected to a first power source and a second power source having a lower voltage than the first power source, the logic gate comprising:
a first driver connected to the first power source, and controlling a connection of a first node to the first power source based on a plurality of externally supplied input signals;
a first control transistor connected between the first node and the second power source to control a voltage of the first node;
a second driver connected between a gate electrode of the first control transistor and the second power source;
a third driver connected between the first power source and the second power source, and driven by a voltage applied to the first node;
a second control transistor connected between the third driver and the second power source, and having a first electrode connected to an output terminal; and
a fourth driver arranged between a gate electrode of the second control transistor and the second power source, and controlling a connection between the gate electrode of the second control transistor and the second power source,
wherein each of the first driver, the second driver, the third driver and the fourth driver includes at least one transistor, and each of the transistors of the first driver, the second driver, the third driver and the fourth driver, the first control transistor and the second control transistor are PMOS transistors.

2. The logic gate as claimed in claim 1, further comprising:
a first capacitor connected between the gate electrode and a first electrode of the first control transistor; and
a second capacitor connected between the gate electrode and the first electrode of the second control transistor.

3. The logic gate as claimed in claim 1, wherein the first driver comprises a plurality of first transistors connected in parallel between the first power source and the first node, and being turned on or turned off based on the input signals.

4. The logic gate as claimed in claim 3, wherein a width/length ratio of the first control transistor is set to a narrower range than a width/length ratio of each of the first transistors.

5. The logic gate as claimed in claim 1, wherein the second driver comprises a second transistor having a first electrode connected to the gate electrode of the first control transistor and a gate electrode and a second electrode that are connected to the second power source.

6. The logic gate as claimed in claim 1, wherein the third driver comprises a first transistor for controlling a connection of the first electrode of the second control transistor to the first power source based on a voltage of the first node.

7. The logic gate as claimed in claim 6, wherein the third driver further comprises a second transistor for controlling a connection of the gate electrode and the first electrode of the second control transistor based on a voltage of the first node.

8. The logic gate as claimed in claim 6, wherein a width/length ratio of the second control transistor is set to a narrower range than that of the first transistor.

9. The logic gate as claimed in claim 6, wherein the fourth driver comprises a first transistor having a first electrode connected to the gate electrode of the second control transistor and a gate electrode and a second electrode that are connected to the second power source.

10. The logic gate as claimed in claim 9, wherein the fourth driver comprises second and third transistors connected in parallel with the first transistor of the fourth driver between the gate electrode of the second control transistor and the second power source, and the first, second and third transistors of the fourth driver are turned on or turned off based on the input signals.

11. The logic gate as claimed in claim 1, further comprising a fifth driver having first transistors connected in parallel between the first electrode and the gate electrode of the first control transistor and the first transistors of the fifth driver are turned on or turned off based on the input signals.

12. The logic gate as claimed in claim 1, wherein the second driver comprises second transistors connected in series between the gate electrode of the first control transistor and the second power source, and the second transistors are turned on or turned off based on bar signals having a reverse polarity to the input signals.

13. A scan driver for driving a plurality of scan lines, comprising:
   at least one decoder including a plurality of AND gates; and
   a plurality of NAND gates respectively connected to the scan lines and generating scan signals by performing a NAND operation on outputs of the decoder,
   wherein:
   each of the AND gates and the NAND gates is composed of a plurality of PMOS transistors, and
   the at least one decoder includes at least two decoders, each NAND sate receiving an output from each decoder.

14. The scan driver as claimed in claim 13, comprising:
   a plurality of input terminals in each of the decoders for receiving externally supplied input signals; and
   a plurality of inverters connected to each of the input terminals to reverse the received input signals.

15. The scan driver as claimed in claim 13, comprising a plurality of input terminals in each of the decoders for receiving externally supplied input signals and bar signals, wherein HIGH polarity portions of the input and input bar signals have a longer period than LOW polarity portions of the input and input bar signals.

16. The scan driver as claimed in claim 13, wherein each of the NAND gates is electrically connected to a first power source and a second power source having a lower voltage than the first power source, and each of the NAND gates comprises:
   a control transistor arranged between the first power source and the second power source, and having an output terminal connected to a first electrode thereof;
   a plurality of first transistors arranged in parallel between a first electrode of the control transistor and the first power source, and respectively receiving externally supplied input signals;
   a plurality of second transistors arranged in parallel between the first electrode and agate electrode of the control transistor, and respectively receiving the input signals; and
   a plurality of third transistors arranged in series between the gate electrode of the control transistor and the second power source, and receiving input bar signals having a reversed polarity relative to the input signals.

17. The scan driver as claimed in claim 16, further comprising a capacitor connected between the first electrode and the gate electrode of the control transistor.

18. The scan driver as claimed in claim 13, wherein each of the AND gates is electrically connected to a first power source and a second power source having a lower voltage than the first power source, and each of the AND gates comprises:

a plurality of first transistors connected in parallel between the first power source and a first node, and receiving externally supplied input signals, respectively;

a first control transistor connected between the first node and the second power source to control a voltage of the first node;

a plurality of second transistors connected in parallel between a gate electrode and a first electrode of the first control transistor, and receiving the respective input signals;

a plurality of third transistors connected in series between the gate electrode of the first control transistor and the second power source, and receiving input bar signals, respectively;

a second control transistor for controlling a voltage supplied to an output terminal;

a fourth transistor connected between the first power source and the second control transistor, and turned on or turned off based on a voltage applied to the first node;

a fifth transistor connected between a gate electrode and a first electrode of the second control transistor, and turned on or turned off based on the voltage applied to the first node; and a plurality of sixth transistors connected in parallel between the gate electrode of the second control transistor and the second power source, and receiving the respective input signals.

19. A display, comprising:
a data driver for supplying a data signal to data lines;
a scan driver for supplying a data signal to scan lines; and
a plurality of pixels connected to the data lines and scan lines and charging a voltage corresponding to the respective data signal when the scan signal is supplied to the respective ones of the data lines and scan lines, wherein:
the scan driver includes:
   at least one decoder including a plurality of AND gates; and
   a plurality of NAND gates connected respectively to respective ones of the scan lines and generating scan signals by performing a NAND operation on outputs of the decoder,
each of the AND gates and the NAND gates is composed of a plurality of PMOS transistors, and
the at least one decoder includes at least two decoders, each NAND gate receiving an output from each decoder.

20. The display as claimed in claim 19, wherein the display includes a plurality of the decoders, and the decoders are arranged such that the decoder of the plurality of decoders receiving relatively higher frequency ones of the input signals is arranged closest to the NAND gates, and the decoder of the plurality of decoders receiving relatively lower frequency ones of the input signals is arranged furthest from the NAND gates.

21. The display as claimed in claim 19, wherein more than one NAND gate receives a same output from one of the at least two decoders.

22. The display as claimed in claim 21, wherein each NAND gate receives a unique combination of outputs from the at least two decoders.

23. The display as claimed in claim 19, wherein the scan driver comprises a plurality of input of input terminals in each of the decoders for receiving externally supplied input signals and bar signals, and HIGH polarity portions of the input and input bar signals have a longer period than LOW polarity portions of the input and input bar signals.

24. The scan driver as claimed in claim 13, wherein more than one NAND gate receives a same output from one of the at least two decoders.

25. The scan driver as claimed in claim 24, wherein each NAND gate receives a unique combination of outputs from one of the at least two decoders.

* * * * *